United States Patent
Fujii

(10) Patent No.: US 9,991,212 B2
(45) Date of Patent: Jun. 5, 2018

(54) SEMICONDUCTOR DEVICE

(71) Applicant: Mitsubishi Electric Corporation, Tokyo (JP)

(72) Inventor: Hidenori Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/256,767

(22) Filed: Sep. 6, 2016

(65) Prior Publication Data

US 2017/0256503 A1    Sep. 7, 2017

(30) Foreign Application Priority Data

Mar. 1, 2016 (JP) ................................. 2016-039067

(51) Int. Cl.
*H01L 23/00* (2006.01)
*H01L 29/40* (2006.01)
(Continued)

(52) U.S. Cl.
CPC .......... *H01L 23/562* (2013.01); *H01L 21/761* (2013.01); *H01L 29/0623* (2013.01); *H01L 29/401* (2013.01); *H01L 29/402* (2013.01); *H01L 29/408* (2013.01); *H01L 29/45* (2013.01); *H01L 29/6609* (2013.01); *H01L 29/868* (2013.01)

(58) Field of Classification Search
CPC . H01L 21/617; H01L 23/562; H01L 29/0623; H01L 29/401; H01L 29/402; H01L 29/408; H01L 29/6609; H01L 29/868
See application file for complete search history.

(56) References Cited

U.S. PATENT DOCUMENTS

| 5,107,323 A | 4/1992 | Knolle et al. |
| 5,545,926 A * | 8/1996 | Kohyama ............. H01L 27/105 |
| | | 257/296 |
| 2011/0278650 A1* | 11/2011 | Tamaki ............. H01L 29/66681 |
| | | 257/288 |

FOREIGN PATENT DOCUMENTS

JP    Hei09-023016 A    1/1997

OTHER PUBLICATIONS

John W. Osenbach et al.; "Semi-Insulating Silicon Nitride (SinSiN) as a Resistive Field Shield"; IEEE Transactions on Electron Devices; Jun. 1990; pp. 1522-1528; vol. 37; No. 6.

* cited by examiner

*Primary Examiner* — Cheung Lee
*Assistant Examiner* — Stephen C Smith
(74) *Attorney, Agent, or Firm* — Studebaker & Brackett PC

(57) ABSTRACT

A semiconductor device includes; a semiconductor substrate including a major surface; a first diffusion region in the major surface in a main cell region; a second diffusion region in the major surface in a terminal region; an insulating film on the major surface and having first and second contact holes on the first and second diffusion regions respectively; a first electrode in the first contact hole and connected to the first diffusion region; a second electrode in the second contact hole and connected to the second diffusion region; a semi-insulating film covering the second electrode; and a third electrode on the first electrode, wherein the first and second electrodes are made of the same material, the first electrode does not completely fill the first contact hole, the second electrode completely fills the second contact hole, and the third electrode completely fills the first contact hole.

8 Claims, 1 Drawing Sheet

(51) Int. Cl.
*H01L 29/06* (2006.01)
*H01L 21/761* (2006.01)
*H01L 29/45* (2006.01)
*H01L 29/66* (2006.01)
*H01L 29/868* (2006.01)

SEMICONDUCTOR DEVICE

BACKGROUND OF THE INVENTION

Field

The present invention relates to a semiconductor device including a diode structure for a power semiconductor.

Background

In a diode for a power semiconductor, a contact hole in a main cell region is filled with a thick AlSi electrode in order to cause a large current to flow vertically. Also, a field limiting ring (FLR) structure is adopted as a terminal structure, and field plate (FP) electrodes are formed on a guard ring (GR) and field limiting rings (FLRs), thereby enabling a depletion layer to extend easily (see, for example, JP 09-023016 A). Further, a semi-insulating protective film is formed on the entire surface of the terminal region for the purpose of stabilizing the potential.

In recent years, there has been a trend to replace wire bonding (WB) with direct lead bonding (DLB) as a method of joining a region for causing a current to flow through a main cell region. Therefore, there have been increasing cases where an electrode for soldering is formed on a main electrode.

In recent years, a need has arisen to make a terminal region finer in order to reduce an ineffective region even in power semiconductors. However, a fine pattern cannot be formed because the film thicknesses of electrodes are large. Even if a fine pattern having a large difference in height and a high aspect ratio can be formed, an electrode fall-down or a crack in a protective film at an electrode step portion is caused by stress from an external package, resulting in a reduction in reliability. On the other hand, making the electrode in the main cell region excessively thin leads to breakdown due to local current concentration, a disconnection due to degradation of coverage at a contact end portion and damage to the Si substrate at the time of forming electrodes to which external electrodes are to be soldered. Thus, there is a problem of failure to realize high reliability.

SUMMARY

In view of the above-described problem, an object of the present invention is to provide a semiconductor device capable realizing high reliability.

According to the present invention, a semiconductor device includes: a semiconductor substrate including a major surface; a first diffusion region formed in the major surface in a main cell region; a second diffusion region formed in the major surface in a terminal region outside the main cell region; an insulating film formed on the major surface and having first and second contact holes formed on the first and second diffusion regions respectively; a first electrode formed in the first contact hole and connected to the first diffusion region; a second electrode formed in the second contact hole and connected to the second diffusion region; a semi-insulating film covering the second electrode; and a third electrode formed on the first electrode, wherein the first and second electrodes are made of the same material, the first electrode does not completely fill the first contact hole, the second electrode completely fills the second contact and the third electrode completely fills the first contact hole.

In the present invention, the first electrode does not completely fill the first contact hole, and the second electrode completely fills the second contact hole. In the case where the first and second electrodes made of the same material are formed simultaneously with each other, therefore, differences in height between the electrodes in the terminal region cart be reduced to inhibit the occurrence of electrode fall-downs and cracks in the protective film at the electrode step portions. Also, current concentration does not occur since the third electrode completely fills the first contact hole, thus achieving high reliability.

Other and further objects, features and advantages of the invention appear more fully from the following description.

DESCRIPTION OF EMBODIMENTS

A semiconductor device according to the embodiments of the present invention will he described with reference to the drawings. The same components will be denoted by the same symbols, and the repeated description thereof may be omitted.

First Embodiment

Figure 1:
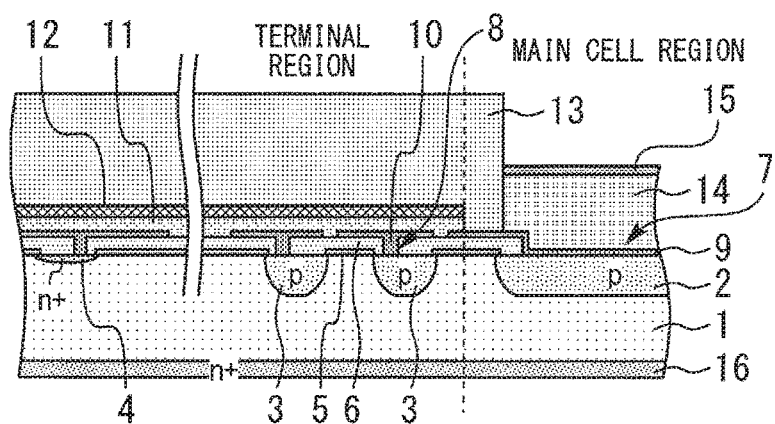
FIG. 1 is a sectional view of a semiconductor device according to a first embodiment of the present invention.

FIG. 1 is a sectional view of a semiconductor device according to a first embodiment of the present invention. In a main cell region, a p-type anode region 2 is formed in a major surface of a Si substrate 1. In a terminal region outside the main cell region, a plurality of p-type ring regions 3 and an $Ni^+$-type ring region 4 are formed in the major surface of the Si substrate 1. An $SiO_2$ oxide film 5 and a TEOS oxide film 6 are formed on the major surface of the Si substrate 1. The $SiO_2$ oxide film 5 and the TEOS oxide film 6 have first and second contact holes 7 and 8 formed on the p-type anode region 2 and the p-type ring regions 3, respectively.

An AlSi electrode 9 is formed in the first contact hole 7 and connected to the p-type anode region 2. A plurality of AlSi electrodes 10 are respectively formed in the plurality of second contact holes 8 and respectively connected to the plurality of p-type ring regions 3. An SiN semi-insulating film 11 and an SiN insulating film 12 provided as protective film cover the plurality of AlSi electrodes 10. Polyimide 13 covers the entire surface except soldering electrode forming portions. An Ni electrode 14 and an Au electrode 15 are successively formed on the AlSi electrode 9 as soldering electrodes to which external electrodes are to be soldered. An $n^+$-type cathode layer 16 is feinted on a back surface of the Si substrate 1.

The AlSi electrodes 9 and 10 are made of the same material and are formed simultaneously with each other. While the AlSi electrode 9 does not completely fill the first contact hole 7, the AlSi electrodes 10 completely fill the second contact holes 8. That is, while the thickness of the AlSi electrode 9 in the first contact hole 7 is smaller than the depth of the first contact hole 7, the thickness of each AlSi electrode 10 filling the second contact hole 8 is larger than the depth of the second contact hole 8. The Ni electrode 14 completely fills the first contact hole 7. That is, the sum of the thicknesses of the AlSi electrode 9 and the Ni electrode 14 filling the first contact hole 7 is larger than the depth of the first contact hole 7.

A method of manufacturing the semiconductor device according to the present embodiment will subsequently be described. First, SiO$_2$ oxide film 5 having a thickness of 3000 to 10000 Å is thermally formed on the Si substrate 1, a pattern is formed by photoengraving and etching, and boron implantation at 1E13 to 1E16 [1/cm$^2$] and drive (at 900 to 1200° C. for 30 to 120 minutes) are thereafter performed to form the p-type anode region 2 in the main cell region and the p-type ring regions 3 in the terminal region simultaneously with each other.

Subsequently, a pattern is formed by photoengraving and etching and As implantation at 1E14 to 1E16 [1/cm$^2$] and drive (at 900 to 1200° C. for 30 to 120 minutes) are thereafter performed to form the n$^+$-type ring region 4 at an outermost peripheral position of the terminal region.

Subsequently, TEOS oxide film 6 having a thickness of 5000 to 10000 Å is deposited and patterned to form the first and second contact holes 7 and 8. AlSi film is then formed by sputtering or deposition to such a thickness that the AlSi film does not completely fill the first contact hole 7 in the main cell region but fills the second contact holes in the terminal region. The AlSi film is patterned to form field plates and the AlSi electrodes 9 and 10.

Subsequently, SiN semi-insulating film 11 having a thickness of 2000 to 10000 Å and a refractive index of 2.2 to 2.7 and SiN insulating film 12 having a thickness of 2000 to 10000 Å and a refractive index of 1.8 to 2.2 are successively formed as protective film, and the protective film in the main cell region is removed.

Subsequently, polyimide 13 is applied on the entire surface to a thickness of several microns, and the applied polyimide in electrode forming regions only is removed. The Si substrate 1 is ground from the back surface to a desired thickness and the n$^+$-type cathode layer 16 is formed by ion implantation (implanting phosphorous or arsenic at 1E13 to 1E16 [1/cm$^2$]) and heat treatment (such as laser anneal). Finally, the Ni electrode 14 and the Au electrode 15 are formed to several microns by plating or sputtering/deposition.

Figure 2:
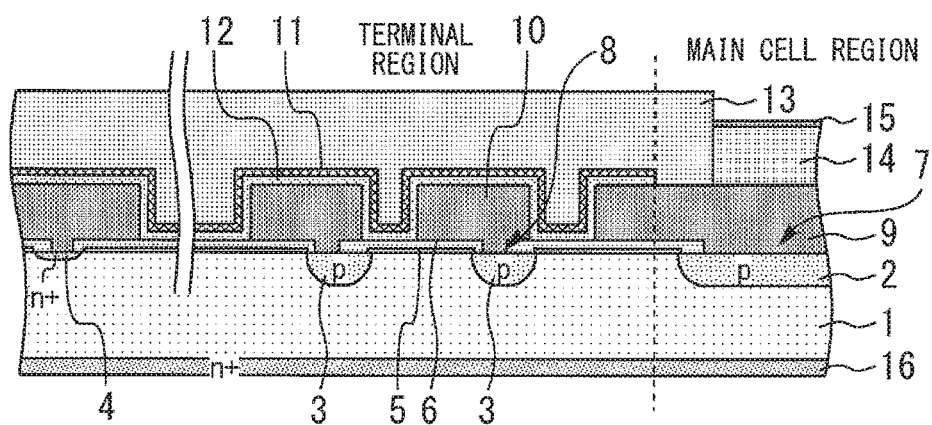
FIG. 2 is a sectional view of a semiconductor device according to the comparative example.

The advantageous effects of the present embodiment will be described by making comparison between the present embodiment and a comparative example. FIG. 2 is a sectional view of a semiconductor device according to the comparative example. In the comparative example, AlSi electrodes 9 and 10 are formed so thick as to completely fill the first and second contact holes 7 and 8. Therefore, stress from an external package can cause an electrode fall-down or a crack in the protective film at an electrode step portion, which reduces the reliability of the semiconductor device.

On the other hand, in the present embodiment, the AlSi electrode 9 does not completely till the first contact hole 7, while the AlSi electrodes 10 completely fill the second contact holes 8. In the case where the AlSi electrodes 9 and 10 made of the same material are formed simultaneously with each other, therefore, differences in height between the electrodes in the terminal region can be reduced to inhibit the occurrence of electrode fall-downs and cracks in the protective film at the electrode step portions. Also, current concentration does not occur since the Ni electrode 14 completely fills the first contact hole 7, thus achieving high reliability.

Second Embodiment

Figure 3:
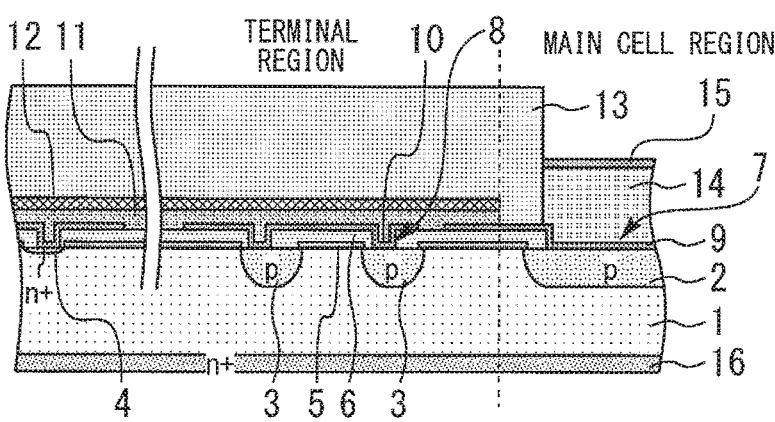
FIG. 3 is a sectional view of a semiconductor device according to a second embodiment of the present invention.

FIG. 3 is a sectional view of a semiconductor device according to a second embodiment of the present invention. The second embodiment differs from the first embodiment in that the AlSi electrodes 10 do not completely fill the second contact holes 8 but the SiN semi-insulating film 11 completely fills the second contact holes 8. Filling with the SiN semi-insulating film 11 in this way produces an equipotential condition even when a disconnection occurs as a result of degradation of contact coverage in the terminal region. The potential at the time of reverse biasing can therefore be borne dividedly by the FLRs and the FPs so that the withstand voltage is stabilized. In other respects, the construction and advantageous effects of the present embodiment are the same as those of the first embodiment.

In the first and second embodiments, barrier metal such as TiN or TiW may he formed under the AlSi electrodes 9 and 10. Damage at the time of forming of the electrodes to which external electrodes are soldered can be inhibited thereby to reduce a leak current. Barrier metal such as TiN or TiW may alternatively be formed in place of the AlSi electrodes 9 and 10. The electrode thickness can be reduced thereby to enable the semiconductor device to be made finer. Pin diode structures of the conduction type reverse to that of the pin diode structure in the first and second embodiments can also be formed in the same way.

A semiconductor substrate formed of a wide-bandgap semiconductor having a bandgap larger than that of silicon may be used as well as the Si substrate 1. The wide-bandgap semiconductor is, for example, silicon carbide, a gallium nitride-based material or diamond. A power semiconductor element formed of such a wide-bandgap semiconductor has a high withstand voltage and a high allowable current density and can therefore be reduced in size. By using this element reduced in size, a semiconductor module incorporating this kind of semiconductor element can be reduced in size. Also, because the heat resistance of the element is high, heat radiating fins of a heat sink can be reduced in size and a water cooling portion of the heat sink can be replaced with an air cooling portion, thus enabling the semiconductor module to be further reduced in size. Further, because the element has reduced power loss and high efficiency, the semiconductor module can be improved in efficiency.

Obviously many modifications and variations of present invention are possible in the light of the above teachings. It is therefore to be understood that within the scope of the appended claims the invention may be practiced otherwise than as specifically described.

The entire disclosure of Japanese Patent Application No. 2016-039067, filed on Mar. 1, 2016 including specification, claims, drawings and summary, on which the Convention priority of the present application is based, is incorporated herein by reference in its entirety.

The invention claimed is:

1. A semiconductor device comprising:
   a semiconductor substrate including a major surface;
   a first diffusion region formed in the major surface in a main cell region;
   a second diffusion region formed in the major surface in a terminal region outside the main cell region;
   an insulating film formed on the major surface and having first and second contact holes formed on the first and second diffusion regions respectively;
   a first electrode formed in the first contact hole and connected to the first diffusion region;
   a second electrode formed in the second contact hole and connected to the second diffusion region;
   a semi-insulating film covering the second electrode; and
   a third electrode formed on the first electrode,
   wherein the first and second electrodes are made of the same material, the first electrode does not completely fill the first contact hole, the second electrode completely fills the second contact hole, and the third electrode completely fills the first contact hole.

2. The semiconductor device according to claim 1, wherein the first and second electrodes include Al-based electrodes.

3. The semiconductor device according to claim 2, wherein the first and second electrodes further include barrier metal formed under the Al-based electrodes.

4. The semiconductor device according to claim 1, wherein the first and second electrodes are harrier metal.

5. A semiconductor device comprising:
a semiconductor substrate including a major surface;
a first diffusion region formed in the major surface in a main cell region;
a second diffusion region formed in the major surface in a terminal region outside the main cell region;
an insulating film formed on the major surface and having first and second contact holes formed on the first and second diffusion regions respectively;
a first electrode formed in the first contact hole and connected to the st diffusion region;
a second electrode formed in the second contact hole and connected to the second diffusion region;
a semi-insulating film covering the second electrode; and
a third electrode formed on the first electrode,
wherein the first and second electrodes are made of the same material,
the first electrode does not completely fill the first contact hole,
the second electrode does not completely fill the second contact hole,
the semi-insulating film completely fills the second contact hole, and
the third electrode completely fills the first contact hole.

6. The semiconductor device according to claim 5, wherein the first and second electrodes include Al-based electrodes.

7. The semiconductor device according to claim 6, wherein the first and second electrodes further include barrier metal formed under the Al-based electrodes.

8. The semiconductor device according to claim 5, wherein the first and second electrodes are barrier metal.

\* \* \* \* \*